United States Patent
Park et al.

(10) Patent No.: US 8,228,748 B2
(45) Date of Patent: Jul. 24, 2012

(54) SEMICONDUCTOR MEMORY DEVICE HAVING REDUCED POWER CONSUMPTION DURING LATENCY

(75) Inventors: Taek-Seon Park, Seoul (KR); Reum Oh, Seoul (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 282 days.

(21) Appl. No.: 12/762,620

(22) Filed: Apr. 19, 2010

(65) Prior Publication Data

US 2010/0265780 A1    Oct. 21, 2010

(51) Int. Cl.
*G11C 8/00* (2006.01)
(52) U.S. Cl. .................... 365/194; 365/233.18
(58) Field of Classification Search .............. 365/233.18
See application file for complete search history.

(56) References Cited

U.S. PATENT DOCUMENTS

| | | | | |
|---|---|---|---|---|
| 5,544,124 A | * | 8/1996 | Zagar et al. | 365/230.08 |
| 6,154,415 A | | 11/2000 | Jeong | |
| 6,292,412 B1 | | 9/2001 | Kato et al. | |
| 6,337,833 B1 | | 1/2002 | Kanazashi et al. | |
| 6,643,215 B2 | * | 11/2003 | Kwak | 365/233.17 |

FOREIGN PATENT DOCUMENTS

| | | |
|---|---|---|
| JP | 10240372 A | 9/1998 |
| JP | 2001014847 A | 1/2001 |
| JP | 2007149341 A | 6/2007 |
| KR | 100230407 B1 | 8/1999 |
| KR | 1020000011667 A | 2/2000 |
| KR | 1020010007603 A | 1/2001 |

* cited by examiner

*Primary Examiner* — Tan T. Nguyen
(74) *Attorney, Agent, or Firm* — Volentine & Whitt, PLLC

(57) ABSTRACT

A semiconductor memory device comprises a latency delay unit that toggles a delay clock signal on during a first interval between a time point where read burst signal is activated and a time point where a latency signal is activated, and subsequently toggling the delay clock signal on during a second interval between a time point where the read burst signal is inactivated and a time point where the latency signal is inactivated.

14 Claims, 5 Drawing Sheets

SEMICONDUCTOR MEMORY DEVICE HAVING REDUCED POWER CONSUMPTION DURING LATENCY

STATEMENT OF RELATED APPLICATIONS

This application claims priority under 35 U.S.C. §119 to Korean Patent Application No. 10-2009-0034274, filed on Apr. 20, 2009, the disclosure of which is hereby incorporated by reference in its entirety.

BACKGROUND

Embodiments of the inventive concept relate generally to semiconductor memory devices. More particularly, embodiments of the inventive concept relate to a semiconductor memory devices in which latent power consumption is reduced.

In a read operation of a semiconductor memory device, the device receives a read command, and then outputs data after a predetermined time. The time between receipt of the read command and output of the data called column address strobe (CAS) latency (CL).

In a semiconductor memory device having multiple memory chips sharing a data transmission line, where one memory chip performs a read operation, other memory chips receive an on-die termination (ODT) command to perform a termination operation. The termination operation terminates data (i.e., prevents transmissions) to prevent data collisions on the shared transmission line.

To prevent data collisions, each memory chip performing a termination operation must terminate data with the same latency as the memory chip performing the read operation. Moreover, in a write operation, memory chips not performing the write operation must terminate data within a certain time frame. In a double data rate 3 (DDR3) semiconductor memory device, for instance, in order to increase signal fidelity, the memory chip performing the write operation is configured to terminate data at the same time as the write operation. Therefore, upon receipt of the ODT command, memory chips not performing the write operation terminate data after a delay corresponding to CAS latency.

Even a memory module having a plurality of semiconductor memory devices which share a data transmission line must terminate data in a similar manner.

In many modern semiconductor memory devices, a burst length for continuously inputting or outputting data to increase an operation speed can be designated. The burst length designates a quantity of data that can be continuously input or output in response to a single command.

In a semiconductor memory device such as a synchronous dynamic random access memory (SDRAM), a data input/output operation is performed in synchronization with a clock signal, and CAS latency is expressed as a number of cycles of the clock signal.

The semiconductor memory device operates in synchronization with the clock signal, and when a read or write command is received, data is read or written after being delayed by a number of clock cycles corresponding to the CAS latency. The data can then be read or written in a quantity corresponding to the burst length.

SUMMARY

Embodiments of the inventive concept provides a semiconductor memory device having a latency circuit that prevents unnecessary toggling of a clock signal during a latency operation to reduce power consumption.

According to one embodiment of the inventive concept, a semiconductor memory device comprises a latency controller and a latency delay unit. The latency controller comprises a burst adjusting unit receiving a first signal and generating a first burst signal, which is activated for a burst length corresponding to a predetermined number of cycles of a clock signal. The latency delay unit generates a delay clock signal in synchronization with the clock signal and delays the first burst signal in response to the delay clock signal by a column address strobe (CAS) latency to generate a latency signal. The delay clock signal is enabled between activation of the first burst signal and activation of the latency signal, and subsequently activated between inactivation of the first burst signal and the latency signal.

In certain embodiments, the latency delay unit comprises a latency signal generator that generates the delay clock signal in response to the clock signal when a clock enable signal is activated, delays the first burst signal in response to the delay clock signal to generate a plurality of delay signals, and outputs one of the delay signals as the latency signal, and a clock enable signal generator that activates the clock enable signal between activation of the first burst signal and activation of the latency signal, and between inactivation of the first burst signal and inactivation of the latency signal.

In certain embodiments, the latency signal generator comprises a first AND gate that logically multiplies the clock enable signal and the clock signal to generate the delay clock signal, and a plurality of flip flops that are cascade-connected to receive and sequentially delay the first burst signal to generate the delay signals in response to the delay clock signal In certain embodiments, the clock enable signal generator comprises a plurality of first XOR gates each calculating and outputting an exclusive logical sum between an input and an output of a corresponding one of the plurality of flip flops, and a first OR gate that logically sums the outputs of the first XOR gates to generate the clock enable signal.

In certain embodiments, the latency delay unit further comprises a latency selection signal generator comprising a plurality of second OR gates that receive and logically sum CAS latency setting values to generate latency selection signals to control a length of the CAS latency.

In certain embodiments, the latency signal generator comprises a plurality of second AND gates logically multiplying the clock enable signal, the clock signal, and the latency selection signals to generate the delay clock signal, a plurality of second flip flops each receiving a portion of the delay clock signal from a corresponding one of the second AND gates, the second flip flops being connected in series to receive and sequentially delay the first burst signal to generate the delay signals in response to the corresponding portion of the delay clock signal, and a multiplexer which selects one of the delay signals and outputs the selected delay signal as the latency signal based on the CAS latency.

In certain embodiments, the clock enable signal generator comprises a plurality of second XOR gates each corresponding to one of the flip flops and configured to calculate and output an exclusive logical sum of a data input and output of the corresponding flip flop, a plurality of third AND gates that logically multiply and output the output of the corresponding second XOR gates and the latency selection signal, and a third OR gate which logically sums output signals of the third AND gates to generate the clock enable signal.

In certain embodiments, the first signal is one of a read signal, a termination signal, and a write signal, and the first burst signal is one of a read burst signal, a termination burst signal, and a write burst signal.

In certain embodiments, the semiconductor memory device further comprises a memory cell array which comprising a plurality of memory cells, a sense amplifier that senses, amplifies and outputs data from the memory cells, a command decoder that decodes a command received from an external source to generate the first signal, a mode setting unit that stores a mode setting code received from an external source and outputs the burst length and the CAS latency based on the stored mode setting code, and a data input/output unit that delays and outputs data from the sense amplifier when the first signal is the read signal, delays write data and supplies the delayed write data to the sense amplifier in response to the write signal and the latency signal when the first signal is the write signal, and terminates data in response to the termination signal and the latency signal when the first signal is the termination signal.

According to one embodiment of the inventive concept, a semiconductor memory device comprises a latency delay unit that toggles a delay clock signal on during a first interval between a time point where read burst signal is activated and a time point where a latency signal is activated, and subsequently toggling the delay clock signal on during a second interval between a time point where the read burst signal is inactivated and a time point where the latency signal is inactivated.

In certain embodiments, the delay clock signal is toggled off during an interval between the first and second intervals.

In certain embodiments, the semiconductor memory device further comprises an array of double data rate synchronous dynamic random access memory cells.

BRIEF DESCRIPTION OF THE DRAWINGS

Embodiments of the inventive concept will be more clearly understood from the following detailed description taken in conjunction with the accompanying drawings. In the drawings, like reference numerals denote like features.

DETAILED DESCRIPTION OF THE EMBODIMENTS

Figure 1:
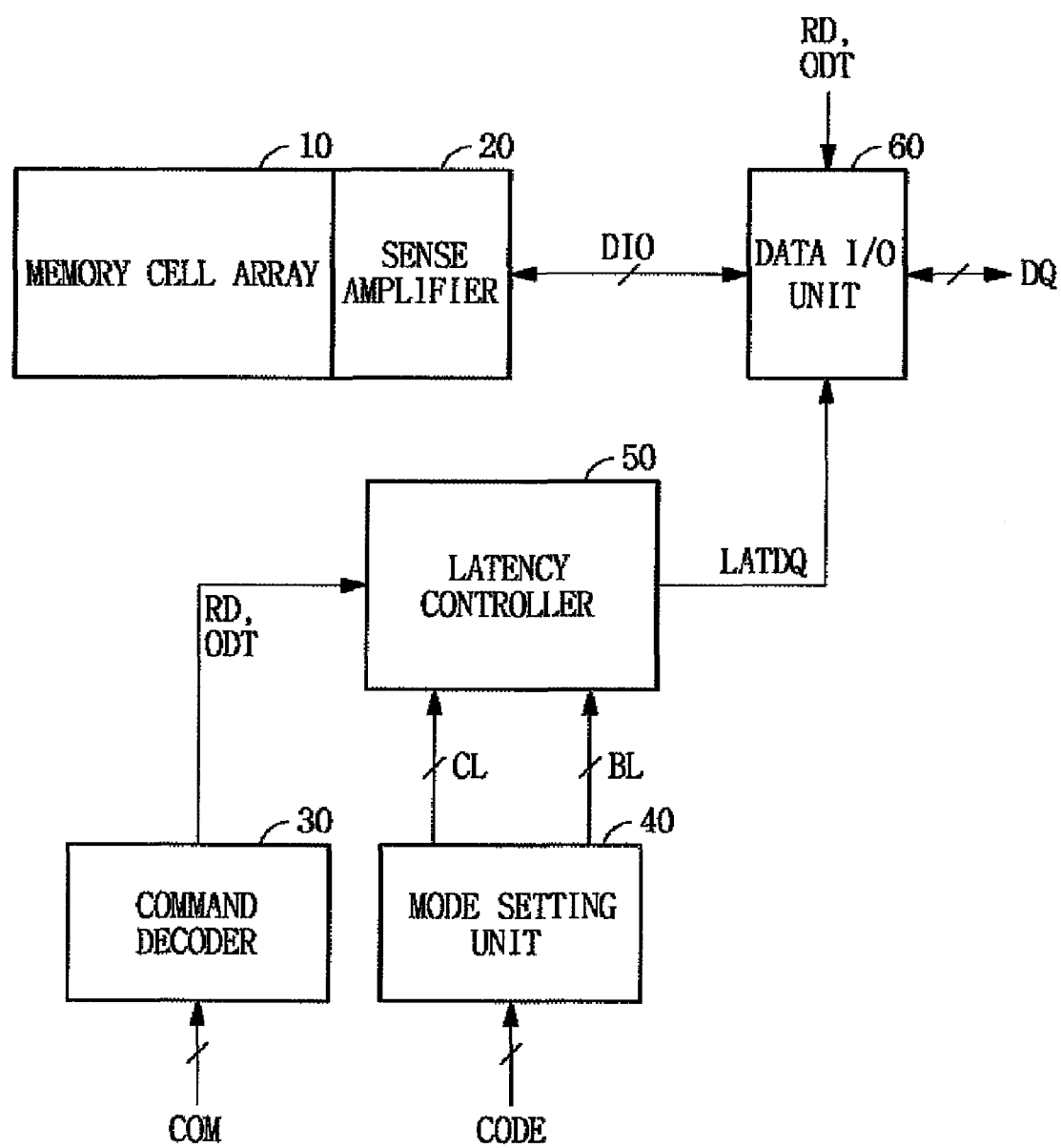
FIG. 1 is a block diagram of a semiconductor memory device according to an embodiment of the inventive concept.

Various embodiments will be described more fully hereinafter with reference to the accompanying drawings. The inventive concept may, however, be embodied in many different forms and should not be construed as being limited to only the illustrated embodiments. Rather, these embodiments are presented as teaching examples.

It will be understood that when an element is referred to as being "on," "connected to" or "coupled to" another element, it can be directly on, connected or coupled to the other element or intervening elements may be present. In contrast, when an element is referred to as being "directly on," "directly connected to" or "directly coupled to" another element, there are no intervening elements present. In the drawings and written description, like reference numbers and labels denote like or similar elements. As used herein, the term "and/or" includes any and all combinations of one or more of the associated listed items.

It will be understood that, although the terms first, second, third, etc., may be used herein to describe various elements, components, regions and/or sections, these elements, components, regions and/or sections should not be limited by these terms. These terms are only used to distinguish one element, component, region or section from another region section. Thus, a first element, component, region or section discussed below could be termed a second element, component, region or section without departing from the teachings of the inventive concept.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments are described herein with reference to cross-sectional illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the inventive concept will be explained in some additional detail with reference to the accompanying drawings.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a block diagram of a semiconductor memory device according to an embodiment of the inventive concept. The semiconductor memory device of FIG. 1 comprises a memory cell array 10, a sense amplifier 20, a command decoder 30, a mode setting unit 40, a latency controller 50, and a data input/output (I/O) unit 60.

Memory cell array 10 comprises a plurality of memory cells adapted to store data. Sense amplifier 20 comprises a plurality of sense amplifiers adapted to sense and amplify data stored in selected memory cells in memory cell array 10, and output the amplified data to data I/O unit 60. The sense amplifiers in sense amplifier 20 are also adapted to store data received from data I/O unit 60 in selected memory cells of memory cell array 10.

Command decoder 30 receives and decodes an external command COM and outputs a read signal RD and an on-die termination signal ODT. Mode setting unit 40 receives a mode setting code CODE in the form of an address or data from an external source and stores various settings of a semiconductor memory device, including CAS latency CL and burst length BL. Latency controller 50 receives read signal RD or termination signal ODT from command decoder 30 and outputs a latency signal LATDQ to data I/O unit 60 in response to CAS latency CL and burst length BL which are set in mode setting unit 40.

Data I/O unit 60 receives latency signal LATDQ, transfers data DIO to and from sense amplifier 20 or terminates data DQ received from an external source in response to read signal RD or termination signal ODT. Data I/O unit 60 outputs or terminates data during a period in which latency signal LATDQ is activated.

Latency signal LATDQ designates a period and timing in which a semiconductor memory device that performs a latency operation receives or outputs data from or to external components. Where read signal RD or termination signal ODT is applied from command decoder 30, latency controller 50 adjusts an activation period of latency signal LATDQ in response to burst length BL set in the mode setting unit 40 and adjusts the activation timing of latency signal LATDQ in response to CAS latency CL. In other words, the semiconductor memory device of FIG. 1 adjusts a data I/O period and timing in response to CAS latency CL and burst length BL at the time of a read or termination operation.

Figure 2:
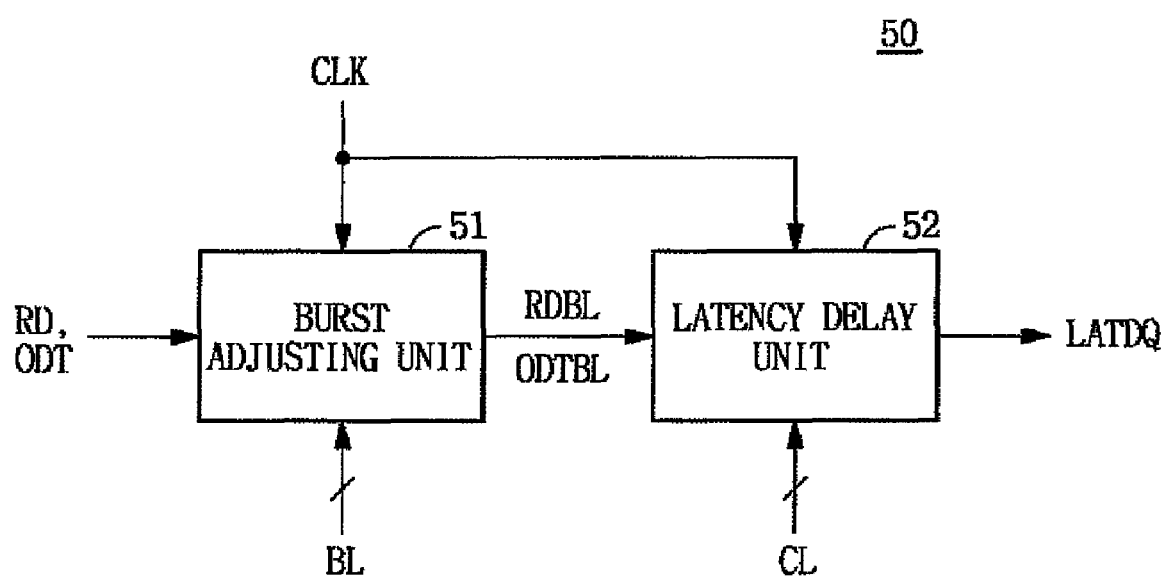
FIG. 2 is a block diagram of a latency setting unit of FIG. 1.

FIG. 2 is a block diagram illustrating an embodiment of latency controller 50 of FIG. 1. In this embodiment, latency controller 50 comprises a burst adjusting unit 51 and a latency delay unit 52. Burst adjusting unit 51 receives burst length BL stored in the mode setting unit 40. In response to burst length BL, burst adjusting unit 51 extends an activation period of read signal RD to output a read burst signal RDBL when read signal RD is applied from command decoder 20, and extends an activation period of termination signal ODT to output a termination burst signal ODTBL when termination signal ODT is applied. Latency delay unit 52 delays read burst signal RDBL or termination burst signal ODTBL and outputs latency signal LATDQ to data I/O unit 60 in response to the CAS latency CL applied from mode setting unit 40.

Figure 3:
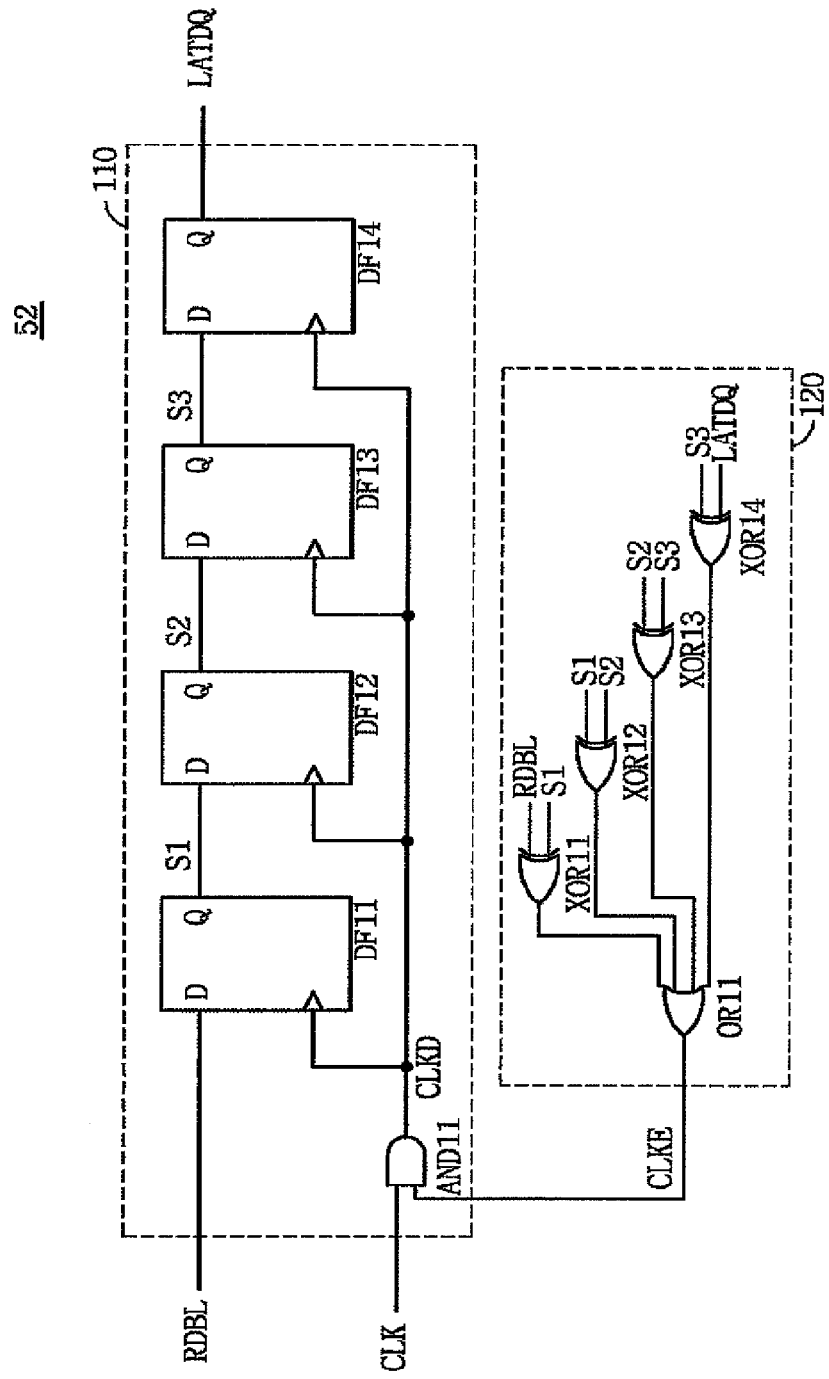
FIG. 3 is a circuit diagram illustrating an example of a latency delay unit of FIG. 2.

FIG. 3 is a circuit diagram illustrating an embodiment of latency delay unit 52 of FIG. 2. In this embodiment, latency delay unit 52 comprises a latency signal generator 110 that receives read burst signal RDBL and delays it by a fixed latency to output latency signal LATDQ under the control of a delay clock signal CLKD. Latency delay unit 52 further comprises a clock enable signal generator 120 generating a clock enable signal CLKE for determining whether or not to generate delay clock signal CLKD.

Latency signal generator 110 comprises an AND gate AND11 that logically multiplies a clock signal CLK and clock enable signal CLKE to generate delay clock signal CLKD and first through fourth flip flops DF11 through DF14 connected in a cascade. First flip flop DF11 receives read burst signal RDBL, and remaining flip flops DF12 through DF14 receive delay signals S1 through S3 which are output from the previous flip flops DF11 through DF13. Flip flops DF11 through DF14 delay input signals RDBL and S1 through S3 and apply them to the next flip flop in response to the delay clock signal CLKD, respectively, and last flip flop DF14 outputs latency signal LATDQ.

Clock enable signal generator 120 comprises XOR gates XOR11 through XOR14 that calculate exclusive logical sums on read burst signal RDBL and corresponding signals among delay signals S1 through S3 output from the flip flops DF11 through DF14. XOR gates XOR11 through XOR14 output the results of the exclusive logical sum operations, and OR gate OR11 logically sums the outputs of XOR gates XOR11 through XOR14 to generate clock enable signal CLKE.

The number of the XOR gates XOR11 to XOR14 is equal to the number of the flip flops DF11 through DF14, and XOR gates XOR11 through XOR14 calculate exclusive logical sums of input signals and output signals of the corresponding flip flops DF11 through DF14 and generate the exclusive logical sum. Therefore, clock enable signal generator 120 activates and outputs clock enable signal CLKE when the input and output signals of at least one of flip flops DF11 through DF14 have different levels from each other.

Figure 4:
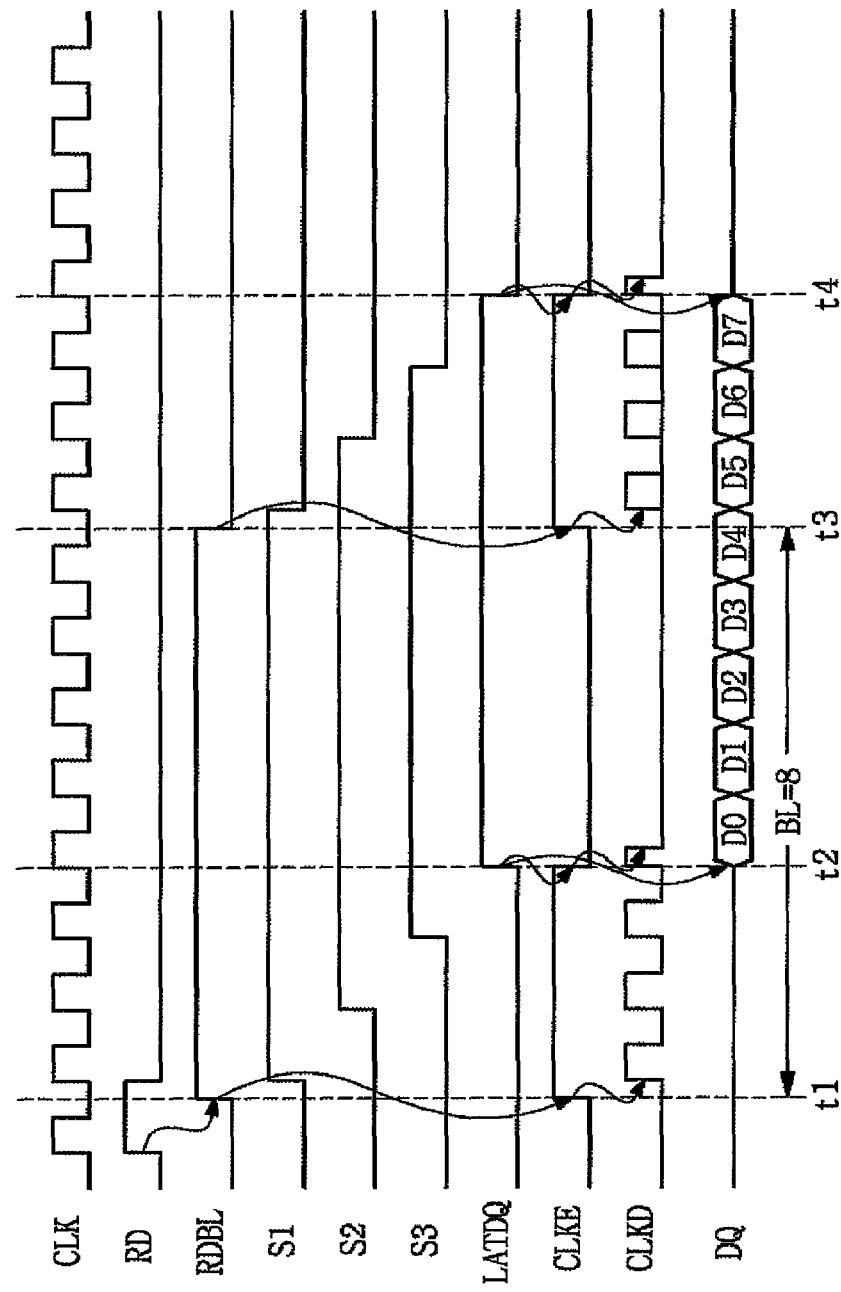
FIG. 4 is a diagram illustrating an operation of a latency delay unit of FIG. 3.

FIG. 4 is a diagram illustrating an operation of latency delay unit 52 of FIG. 3. Referring to FIGS. 1 through 3, where command decoder 30 activates and outputs read signal RD in response to external command COM, burst adjusting unit 51 extends the activation period of read signal RD to output read burst signal RDBL in response to burst length BL applied from mode setting unit 40. In FIG. 4, the burst length is 8, and read burst signal RDBL is activated to a high level during 8 clock cycles of clock signal CLK. However, burst length BL may be variously adjusted.

In FIG. 4, read burst signal RDBL is applied from burst adjusting unit 51 to latency delay unit 52 at a first time t1. In response, XOR gate XOR11 of clock enable signal generator 120 outputs a signal of a high level since read burst signal RDBL and delay signal S1 differ in signal level, and OR gate OR11 activates clock enable signal CLKE to a high level and outputs clock enable signal CLKE with a high level.

AND gate AND11 of latency signal generator 110 logically multiplies clock signal CLK and clock enable signal CLKE to output delay clock signal CLKD which toggles at the same cycle as clock signal CLK. Flip flops DF11 through DF14 receive, delay, and output read burst signal RDBL and corresponding delay signals S1 through S3. Where delay clock signal CLKD toggles once, input signal RDBL and output signal S1 of first flip flop DF11 have the same level, causing XOR gate XOR11 to output a signal with a low level. However, since input signal S1 and output signal S2 of second flip flop DF12 have different levels from each other, XOR gate XOR12 outputs a signal with a high level, clock enable signal CLKE maintains an activated state, and delay clock signal CLKD is output continuously from AND gate AND11. Since the flip flops DF11 through DF14 are cascade-connected, delay signals S1 through S3 are sequentially activated, and all of read burst signal RDBL and delay signals S1 through S3 move to a high level at a second time t2.

Where all of read burst signal RDBL and delay signals S1 through S3 are at a high level, all of XOR gates XOR11 through XOR14 output signals with a low level. Therefore, clock enable signal CLKE is inactivated to a low level, and delay clock signal CLKD does not toggle. Since delay clock signal CLKD does not toggle, flip flops DF11 through DF14 do not operate, thereby reducing power consumption.

Read burst signal RDBL is activated during a time corresponding to burst length BL after first time t1. Thereafter, read burst signal RDBL is inactivated to a low level at a third time t3. At time t3, read burst signal RDBL and delay signal S1 differ in signal level, and therefore XOR gate XOR11 outputs a signal of a high level, causing OR gate OR11 to output clock enable signal CLKE with a high level.

Thereafter, at a fourth time t4, all of the read burst signal RDBL and delay signals S1 to S3 move to a low level. As a result, all of XOR gates XOR11 through XOR14 output signals with a low level, clock enable signal CLKE is inactivated to a low level, and delay clock signal CLKD does not toggle. In other words, in this embodiment of latency delay unit 52, delay clock signal CLKD toggles until latency signal LATDQ is activated or inactivated after read burst signal RDBL is activated or inactivated, and flip flops DF11 through DF14 operate in response to delay clock signal CLKD. Therefore, an operation of latency signal generator 110 is minimized, which reduces power consumption.

Figure 5:
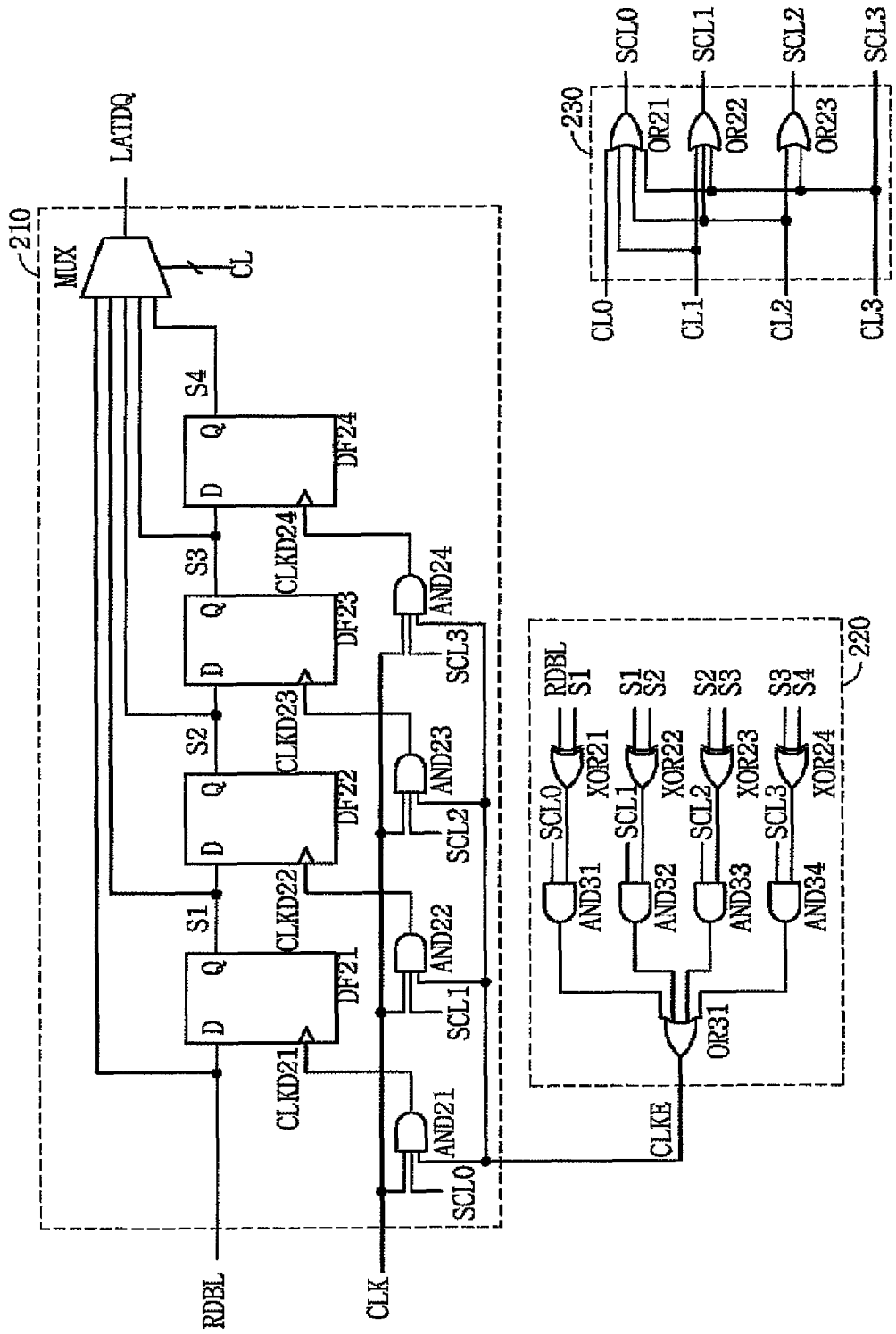
FIG. 5 is a circuit diagram illustrating another example of a latency delay unit of FIG. 2.

FIG. 5 is a circuit diagram illustrating another embodiment of latency delay unit 52 of FIG. 2. Latency delay unit 52 of FIG. 5 is configured to adjust a delay time according to CAS latency CL received from mode setting unit 40.

In the embodiment of FIG. 5, latency delay unit 52 comprises a latency signal generator 210 that adjusts a delay time in response to a CAS latency CL and delays read burst signal RDBL to output latency signal LATDQ in response to the adjusted delay time and delay clock signal CLKD. Latency delay unit 52 further comprises a clock enable signal generator 220 that generates clock enable signal CLKE to determine whether or not to generate the delay clock signal, and a latency selection signal generator 230 that activates and outputs at least one of latency selection signals SCL0 through SCL3 in response to CAS latencies CL0 through CL3 applied from mode setting unit 40.

Latency selection signal generator 230 comprises a plurality of OR gates OR21 through OR23. OR gates OR21 through OR23 receive and logically sum corresponding CAS latencies CL0 through CL3 with the higher order CAS latencies to generate respective latency selection signals SCL0 through SCL3. For instance, OR gate OR21 receives and logically sums CAS latency CL0 and CAS latencies CL1 through CL3 to generate latency selection signal SCL0. Similarly, OR gate OR22 receives and logically sums CAS latency CL1 with CAS latencies CL2 and CL3 to generate output latency selection signal SCL1, and OR gate OR23 receives and logically sums the CAS latency CL3 and CAS latency CL2 to generate output latency selection signal SCL2. Accordingly, where CAS latency CL1 is activated, latency signal generator 230 activates the two latency selection signals SCL0 and SCL1.

Similarly, if CAS latency CL3 is activated, latency signal generator 230 activates all of the latency selection signals CL0 to CL3.

CAS latency CL3 is output as latency selection signal SCL3. Accordingly, where CAS latency CL3 is activated, latency selection signal SCL3 is activated as well. Because there is no logic gate between CAS latency CL3 and latency selection signal SCL3, the activation timing of latency selection signal SCL3 may be different from the activation timing of other latency selection signals SCL0 to SCL2. Accordingly, a buffer or an OR gate may be inserted in latency signal generator 230 (e.g., between signals CL3 and SCL3) for stability of operation and convenience of design. In general, the number of the OR gates in the latency selection signal generator 230 is equal to or smaller than the number of the CAS latencies CL0 to CL3 which can be set in the mode setting unit 40.

Latency signal generator 210 comprises a plurality of flip flops DF21 through DF24 that are cascade-connected, a plurality of AND gates AND21 through AND 24 corresponding to the flip flops DF21 through DF24, and a multiplexer MUX. AND gates AND21 through AND24 receive and logically multiply clock signal CLK, clock enable signal CLKE, and corresponding latency selection signals SCL0 to SCL3, and generate delay clock signals CLKD21 through CLKD24. A first flip flop DF21 among flip flops DF21 through DF24 receives read burst signal RDBL, and the remaining flip flops DF22 through DF24 receive delay signals S1 through S3 output from corresponding previous flip flops DF21 through DF23. Flop flops DF21 through DF24 delay input signals RDBL and S1 through S3 to output delay signals S1 through S4 in response to delay clock signals CLKD21 through CLKD24. Multiplexer MUX selects one of read burst signal RDBL and delay signals S1 through S4 output from the flip flops DF21 through DF24 and outputs the selected signal as latency signal LATDQ in response to CAS latency CL.

Clock enable signal generator 220 comprises a plurality of XOR gates XOR21 through XOR24 that calculate exclusive logical sums of read burst signal RDBL and delay signals S1 through S3 output from flip flops DF21 through DF24 and output the exclusive logical sum results to corresponding AND gates AND31 through AND34. AND gates AND31 through AND34 logically multiply the outputs of XOR gates XOR21 through XOR24 and latency selection signals SCL0 to SCL3 as illustrated in FIG. 5, and output the corresponding logical products. An OR gate OR31 logically sums the logical products generated by AND gates AND31 to AND34 to generate clock enable signal CLKE.

Like clock enable signal generator 120 of FIG. 3, clock enable signal generator 220 is configured such that the number of XOR gates XOR21 through XOR24 is equal to the number of flip flops DF21 through DF24; XOR gates XOR21 through XOR24 calculate exclusive logical sums of the input signals and the output signals of the corresponding flip flops DF21 through DF24 and output the exclusive logical sum results. AND gates AND31 through AND34 logically multiply and output the corresponding latency selection signals SCL0 through SCL3 and the output signals of the corresponding XOR gates XOR21 through XOR24. OR gate OR31 logically sums the output signals of AND gates AND31 through AND34 to output clock enable signal CLKE.

Latency delay unit 52 of FIG. 3 delays by a fixed latency, and thus clock enable signal generator 120 logically sums the output signals of XOR gates XOR11 through XOR14 to generate clock enable signal CLKE. However, latency delay unit 52 of FIG. 5 adjusts the delay time of read burst signal RDBL according to a variable CAS latency CL, and thus where the output signals of XOR gates XOR21 through XOR24 are logically summed to generate clock enable signal CLKE, delay clock signal CLKD unnecessarily toggles. Therefore, the clock enable signal generator 220 of FIG. 5 further comprises the AND gates AND31 to AND34, and AND gates AND31 through AND34 logically multiply and output corresponding latency selection signals SCL0 through SCL3 and the output signals of the corresponding XOR gates XOR21 through XOR24. Therefore, an activation period of clock enable signal CLKE is adjusted according to CAS latency CL.

In selected embodiments of the inventive concept, as described above, a semiconductor memory device generates a delay clock signal between a time point where read burst signal is activated and a time point where a latency signal is activated. The semiconductor device also generates the delay clock signal between a time point where the read burst signal is inactivated and a time point where the latency signal is inactivated. This generation of the delay clock signal occurs regardless of whether a latency delay unit of a latency controller has a fixed delay time or a variable delay time based on CAS latency. In other words, the delay clock signal is toggled on for a necessary period, and delay and latch operations of the read burst signal are performed in response to the delay clock signal, thereby reducing power consumption.

A first process performed by a latency controller 50 to receive read signal RD and generate latency signal LATDQ has been described above. A second process performed by a latency controller 50 to receive a termination signal ODT and generate an output latency signal LATDQ is the substantially the same as the first process, and therefore a detailed description of the second process will be omitted to avoid redundancy. Additionally, the above-described inventive concept can be used to control latency in write operations as well as read operations. In the above-described examples, the term "activated" has been used to denote voltages at a high level. However, in alternative embodiments, activation could also refer to voltages at other levels.

As described above, semiconductor memory devices according to selected embodiments prevent unnecessary toggling of an internal clock signal during latency operations to reduce power consumption.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor memory device, comprising:
 a latency controller comprising:
 a burst adjusting unit receiving a first signal and generating a first burst signal that is activated for a burst length corresponding to a predetermined number of cycles of a clock signal; and
 a latency delay unit generating a delay clock signal in synchronization with the clock signal and delaying the first burst signal in response to the delay clock signal by a column address strobe (CAS) latency to generate a latency signal;
 wherein the delay clock signal is enabled between activation of the first burst signal and activation of the latency signal, and subsequently activated between inactivation of the first burst signal and the latency signal.

2. The semiconductor memory device of claim 1, wherein the latency delay unit comprises:
 a latency signal generator that generates the delay clock signal in response to the clock signal when a clock enable signal is activated, delays the first burst signal in response to the delay clock signal to generate a plurality of delay signals, and outputs one of the delay signals as the latency signal; and
 a clock enable signal generator that activates the clock enable signal between activation of the first burst signal and activation of the latency signal, and between inactivation of the first burst signal and inactivation of the latency signal.

3. The semiconductor memory device of claim 2, wherein the latency signal generator comprises:
 a first AND gate that logically multiplies the clock enable signal and the clock signal to generate the delay clock signal; and
 a plurality of flip flops that are cascade-connected to receive and sequentially delay the first burst signal to generate the delay signals in response to the delay clock signal.

4. The semiconductor memory device of claim 3, wherein the clock enable signal generator comprises:
 a plurality of first XOR gates each calculating and outputting an exclusive logical sum between an input and an output of a corresponding one of the plurality of flip flops; and
 a first OR gate that logically sums the outputs of the first XOR gates to generate the clock enable signal.

5. The semiconductor memory device of claim 2, wherein the latency delay unit further comprises a latency selection signal generator comprising:
 a plurality of second OR gates that receive and logically sum CAS latency setting values to generate latency selection signals to control a length of the CAS latency.

6. The semiconductor memory device of claim 5, wherein the latency signal generator comprises:
 a plurality of second AND gates logically multiplying the clock enable signal, the clock signal, and the latency selection signals to generate the delay clock signal;
 a plurality of second flip flops each receiving a portion of the delay clock signal from a corresponding one of the second AND gates, the second flip flops being connected in series to receive and sequentially delay the first burst signal to generate the delay signals in response to the corresponding portion of the delay clock signal; and
 a multiplexer which selects one of the delay signals and outputs the selected delay signal as the latency signal based on the CAS latency.

7. The semiconductor memory device of claim 6, wherein the clock enable signal generator comprises:
 a plurality of second XOR gates each corresponding to one of the flip flops and configured to calculate and output an exclusive logical sum of a data input and output of the corresponding flip flop;
 a plurality of third AND gates that logically multiply and output the output of the corresponding second XOR gates and the latency selection signal; and a third OR gate which logically sums output signals of the third AND gates to generate the clock enable signal.

8. The semiconductor memory device of claim 7, wherein the first signal is one of a read signal, a termination signal, and a write signal, and the first burst signal is one of a read burst signal, a termination burst signal, and a write burst signal.

9. The semiconductor memory device of claim 8, further comprising:
- a memory cell array which comprising a plurality of memory cells;
- a sense amplifier that senses, amplifies and outputs data from the memory cells;
- a command decoder that decodes a command received from an external source to generate the first signal;
- a mode setting unit that stores a mode setting code received from an external source and outputs the burst length and the CAS latency based on the stored mode setting code; and
- a data input/output unit that delays and outputs data from the sense amplifier when the first signal is the read signal, delays write data and supplies the delayed write data to the sense amplifier in response to the write signal and the latency signal when the first signal is the write signal, and terminates data in response to the termination signal and the latency signal when the first signal is the termination signal.

10. A semiconductor memory device comprising:
a latency delay unit that toggles a delay clock signal on during a first interval between a time point where read burst signal is activated and a time point where a latency signal is activated, and subsequently toggling the delay clock signal on during a second interval between a time point where the read burst signal is inactivated and a time point where the latency signal is inactivated.

11. The semiconductor memory device of claim 10, wherein the delay clock signal is toggled off during an interval between the first and second intervals.

12. The semiconductor memory device of claim 10, further comprising:
an array of double data rate synchronous dynamic random access memory cells.

13. The semiconductor memory device of claim 10, further comprising:
- a burst adjusting unit receiving a first signal and generating a first burst signal that is activated for a burst length corresponding to a predetermined number of cycles of a clock signal;
- wherein the latency delay unit generates the delay clock signal in synchronization with the clock signal and delays the first burst signal in response to the delay clock signal by a column address strobe (CAS) latency to generate a latency signal;
- wherein the delay clock signal is enabled between activation of the first burst signal and activation of the latency signal, and subsequently activated between inactivation of the first burst signal and the latency signal.

14. The semiconductor memory device of claim 13, wherein the latency delay unit comprises:
- a latency signal generator that generates the delay clock signal in response to the clock signal when a clock enable signal is activated, delays the first burst signal in response to the delay clock signal to generate a plurality of delay signals, and outputs one of the delay signals as the latency signal; and
- a clock enable signal generator that activates the clock enable signal between activation of the first burst signal and activation of the latency signal, and between inactivation of the first burst signal and inactivation of the latency signal.

* * * * *